United States Patent [19]

Afshari et al.

[11] Patent Number: 5,133,119
[45] Date of Patent: Jul. 28, 1992

[54] SHEARING STRESS INTERCONNECTION APPARATUS AND METHOD

[75] Inventors: Bahram Afshari, Menlo Park; Farid Matta, Mountain View; Lawrence Hanlon, Menlo Park, all of Calif.

[73] Assignee: Hewlett-Packard Company, Palo Alto, Calif.

[21] Appl. No.: 662,095

[22] Filed: Feb. 28, 1991

[51] Int. Cl.⁵ .......................... H01R 9/00; H01R 9/14
[52] U.S. Cl. ........................................ 29/842; 29/844; 439/66
[58] Field of Search ............... 29/827, 842, 844; 439/55, 65, 66, 67, 73, 74, 77

[56] References Cited

U.S. PATENT DOCUMENTS

| | | | |
|---|---|---|---|
| 3,736,549 | 5/1973 | Clements | 439/329 |
| 4,012,093 | 3/1977 | Crane | 439/417 |
| 4,367,004 | 1/1983 | Fujiura et al. | 439/396 |
| 4,865,193 | 9/1989 | Shimamoto et al. | 206/330 |

Primary Examiner—P. W. Echols

[57] ABSTRACT

An apparatus and method for providing electrical contact between an array of fingers of a tape automated bonding frame and a corresponding array of raised contact areas on a substrate. The tape automated bonding frame is preferably a multi-metal member having at least one utility plane. A load plate having downwardly projecting regions is pressed onto the tape automated bonding frame on a side opposite to the substrate. The substrate may be a printed circuit board and the raised contact areas may be conductive pads. The ends of the fingers of the tape automated bonding frame are precisely aligned with the raised contact areas of the substrate. The downwardly projecting regions of the load plate are generally rigid and provide a compression force between adjacent contact areas and between adjacent finger ends. Displacement of the tape automated bonding frame provided by the downwardly projecting regions of the load plate cause the finger ends to conform to the upper surfaces of the contact areas, thereby insuring effective electrical contact between the finger ends and the contact areas.

17 Claims, 3 Drawing Sheets

SHEARING STRESS INTERCONNECTION APPARATUS AND METHOD

TECHNICAL FIELD

The present invention relates generally to tape automated bonding and particularly to interfacing of a tape automated bonding frame to a substrate.

BACKGROUND ART

The increasing complexity and density of circuitry on a printed circuit board and of components on the circuit board increases the difficulty of diagnosing, servicing and repairing improperly functioning printed circuit boards. Even with stringent quality control measures, circuit components have a certain probability of failure. Pretesting components increases product yield, but various circuit components are difficult to test prior to electrical connection to a printed circuit board. For example, an individual integrated circuit chip may have hundreds of closely spaced contact pads, rendering pretesting an arduous task.

One interconnection technique which permits pretesting of chips is referred to as "tape automated bonding." This fabrication procedure utilizes a continuous insulated tape which is similar to photographic film to provide a planar substrate for chips that are attached to individual sections, or frames, of the tape. A spider-like metal pattern of conductive traces is etched on each frame. The traces may either "fan out", i.e. radiate from the center of the frame to the four edges, or may consist of four sets of parallel lines, with each set extending perpendicularly from one edge of the chip. The chip is carefully aligned over the center of the frame so that the contact pads of the chip are precisely located at corresponding conductive traces in the central portion of the frame. The chip is then attached to the tape automated bonding frame. This connection of the chip contact pads to the inner portion of the frame is referred to as "inner lead bonding."

After the inner lead bonding has been performed, the integrated circuit chip may be tested. The chip is thoroughly exercised electrically. The outer lead ends of the frame of a properly functioning chip are typically microbonded to pads on a substrate, such as a printed circuit board. The attachment of the conductive traces of the frame to the pads of the substrate is referred to as "outer lead bonding."

Proper alignment of the tape automated bonding frame with the substrate during outer lead bonding is critical. The conductive traces of the frame are closely spaced. A center-to-center distance, or "pitch", between conductive traces may be 4 mils. Fineline tape automated bonding frames increase the chances of electrical short circuits and of electrical failures resulting from misalignment.

In addition to achievement of precise alignment, planarity is an important consideration in outer lead bonding. The thinness of the leads of fineline tape automated bonding frames makes it more difficult to achieve the necessary flatness. U.S. Pat. No. 4,865,193 to Shimamoto et al. teaches use of reinforcing members on a tape automated bonding frame to reduce stresses exerted on the conductive traces during molding of the chips, thereby minimizing deformations of the conductive leads.

The requirement of planarity of the conductive traces of the frame and planarity of the pads of the substrate becomes more stringent with use of the interconnect system referred to as demountable tape automated bonding. In this system, outer lead bonding is not a microbonding technique, but rather is provided by elastomeric pressure of the outer lead ends onto the pads of the substrate. An advantage of this interconnect system is that a defective chip and its tape automated bonding frame can be easily replaced. However, the interconnect system suffers from two difficulties. Firstly, relaxation of the elastomeric pressure over time and degradation of the elastomer due to temperature variation jeopardize the electrical contact at the outer lead ends. Secondly, in high frequency applications the tape automated bonding frame includes a ground plane on a side of the insulated tape opposite to the conductive leads. This two-metal frame is very rigid and will not easily conform to the pads of the substrate. Such conformity is important in demountable tape automated bonding, but is difficult to achieve with use of elastomeric pressure.

An object of the present invention is to provide an apparatus and method which facilitates repair and replacement of a tape automated bonding frame and which insures conformity of the frame with contact areas of a substrate to which the frame is electrically connected.

SUMMARY OF THE INVENTION

The above object has been met by an apparatus and method of tape automated bonding interconnection which, rather than being associated with a stringent requirement of planarity, induces a deformation of the tape automated bonding frame. A load plate exerts a deforming force on the frame at regions of the frame between contact areas of an interconnection substrate, such as a printed circuit board. The load plate includes generally rigid projections which operate with the contact areas to provide a shearing force on the frame to induce displacement of frame regions between the contact areas, relative to other regions of the frame.

The tape automated bonding frame includes a plurality of conductive traces having inner lead ends bonded to an electronic component, such as an integrated circuit chip. Outer lead ends of the frame are arranged in a manner corresponding to the contact areas on the substrate. Typically, the contact areas are pads or conductive board traces. The rigid projecting members of the load plate are aligned so that the frame is contacted along regions spaced apart from the ends of the outer leads of the frame.

In contrast to prior art demountable tape automated bonding interconnection wherein elastomeric pressure provides a distributed load, the present invention causes a displacement of regions of the frame. This displacement urges the frame to conform to the contact areas of the substrate. The forces involved provide an elastic deformation, so that the tape automated bonding frame may be used repeatedly. Displacement is less than the height of the contact areas of the substrate.

An advantage of the present invention is that a defective integrated circuit chip and its tape automated bonding frame may be removed and replaced without concern of microbonding of the outer lead ends to the substrate. Thus, removal of a frame leaves a clean contact area, rather than one which includes solder and residue. Another advantage of the present invention is that the interconnect approach is not associated with a stringent requirement on planarity of either the contact areas of the substrate or the outer lead ends of the frame. This results in a higher yield of the individual parts.

BEST MODE FOR CARRYING OUT THE INVENTION

Figure 1:
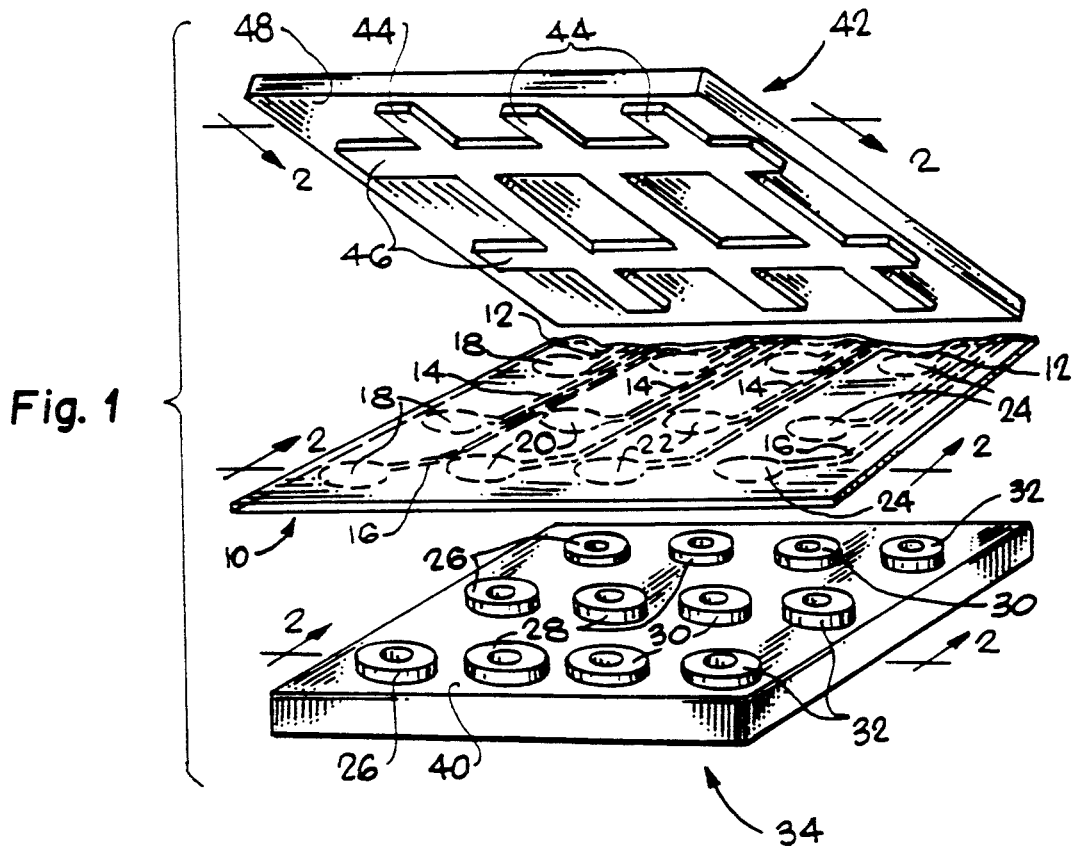
FIG. 1 is an exploded perspective view of a tape automated bonding interconnect system in accord with the present invention.

With reference to FIG. 1, a portion of a tape automated bonding frame 10 is shown as having a plurality of series of three signal traces 12, 14 and 16 extending to four columns of outer lead ends 18, 20, 22 and 24. The pattern of the outer lead ends 18-24 corresponds to a pattern of contact areas, typically vias 26, 28, 30 and 32, on a substrate 34.

The signal traces 12-16 include inner lead ends, not shown, connected to contact pads on an integrated circuit chip. While only twelve signal traces and outer lead ends 18-24 are illustrated, typically a tape automated bonding frame 10 includes far more signal traces. An exemplary configuration would be a frame having a total of 432 signal traces leading to outer lead ends arranged in eighteen columns and six rows on each of four sides of a square integrated circuit chip. The configuration of the signal traces and the outer lead ends is not critical to the present invention.

Figure 2:
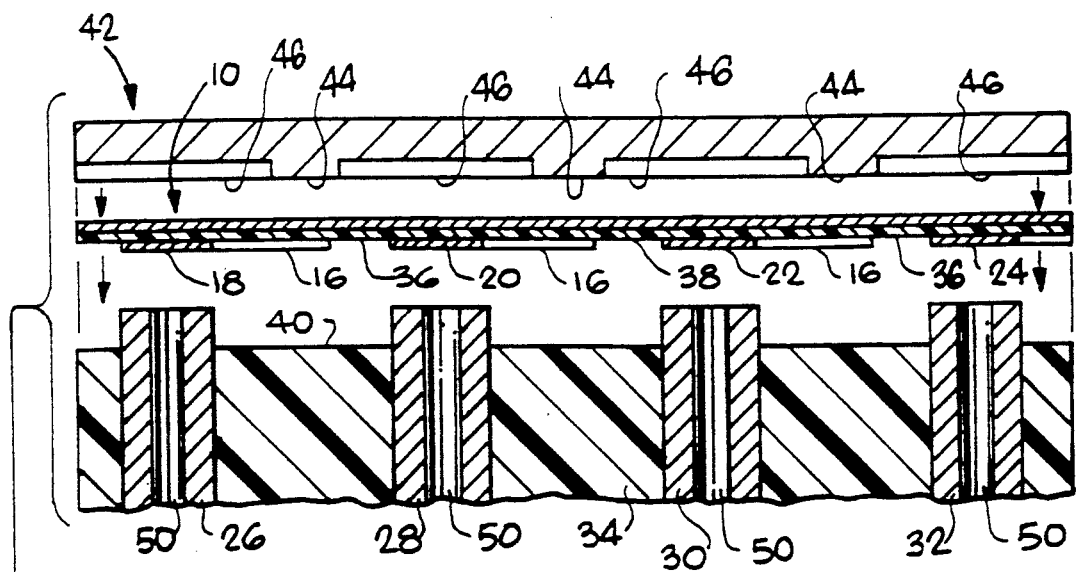
FIG. 2 is a side sectional view of the interconnect system of FIG. 1 taken along lines 2—2.

Referring now to FIGS. 1 and 2, the signal traces 12-16 are formed from a copper foil. The copper foil is photolithographically patterned and etched to provide electrically isolated traces. To aid in ensuring effective contact of the outer lead ends 18-22 with the vias 26-32 of the substrate 34, the copper signal traces are preferably nickel plated and covered with a coating of gold. An insulative tape 36 is used to support the fragile signal traces. The insulative tape is a polymer having a hole at its center for mounting of the integrated circuit chip. Optionally, the tape automated bonding frame 10 may include a utility plane 38. For example, the plane 38 may be at ground potential, or at a potential of 5 volts d.c.

The vias 26-32 of the substrate 34 are manufactured in any manner known in the art. For example, the opposed major surfaces 40 of the substrate may have a copper foil about a hole through the substrate. Thus, rather than the cylindrical vias shown in FIG. 2, the vias would include an expanded portion along the major surface 40 of the substrate 34. The copper foils and the holes are then plated with a layer of conductive material. The substrate 34 may be a printed circuit board or the like.

Electrical communication between an integrated circuit chip supported by the tape automated bonding frame 10 and outside circuitry is provided by connection of the outer lead ends 18-24 to the vias 26-32 of the substrate 34. Interconnection of outer lead ends of a tape automated bonding frame to contact areas on a substrate has typically been accomplished by soldering the two corresponding patterns together. However, upon detection of a defective integrated circuit chip, replacement requires desoldering and cleaning each of the hundreds of contact areas on the substrate. To facilitate replacement, elastomeric pressure has recently been used to provide a distributed load across the tape automated bonding frame onto the contact areas of a substrate. One difficulty with this approach is that the elastomeric pressure relaxes with the passage of time and with degradation of the elastomer. Moreover, this approach carries with it a stringent requirement on planarity of the contact areas of the substrate.

As shown in FIGS. 1 and 2, a load plate 42 is positioned above the tape automated bonding frame 10. The load plate includes a plurality of intersecting ribs 44 and 46 projecting from a bottom surface 48 of the load plate. A series of three parallel ribs 44 are aligned with the centers between adjacent columns of outer lead ends 18-24. Perpendicular to the three ribs 44 are a pair of ribs 46 positioned to contact the areas between the rows of outer lead ends. Thus, as the load plate 42 is pressed into position, the projecting ribs 44 and 46 provide a compression force onto the tape automated bonding frame 10 between the outer lead ends 18-24 and between the vias 26-32.

Figure 3:
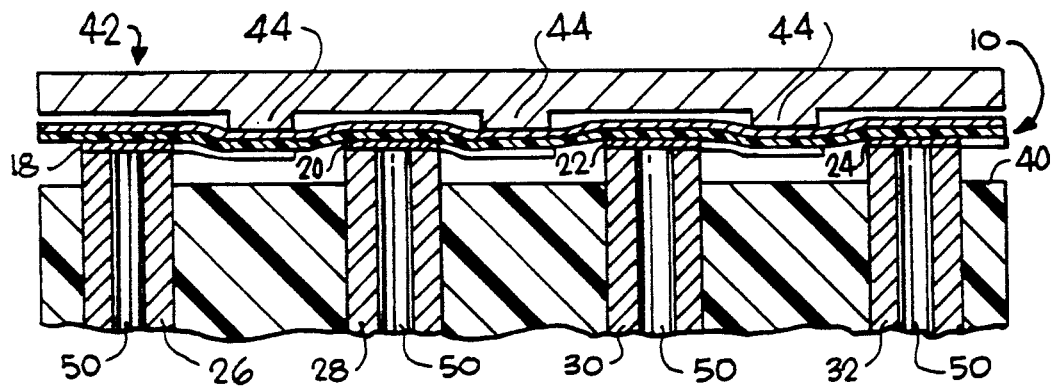
FIG. 3 is a side sectional view of the interconnect system of FIG. 2, shown in an intermediate position.

Referring now to FIG. 3, the load plate 42 is shown in an intermediate position. Here, the ribs 44 press downwardly onto the tape automated bonding frame 10 between the outer lead ends 18-24. The displacement of the tape automated bonding frame provides a force for conforming the outer lead ends to the shape of the top surfaces of the vias 26-32. Optimally, the top surface of each via is a planar surface. This optimal condition, however, is not easily achieved in high-yield, low-cost production of printed circuit boards. The ribs 44 of the load plate 42 ensure conformity of the outer lead ends to the vias, so that the requirement of planarity is not as stringent as it is with use of elastomeric pressure to interconnect the tape automated bonding frame to the substrate 34.

Figure 4:
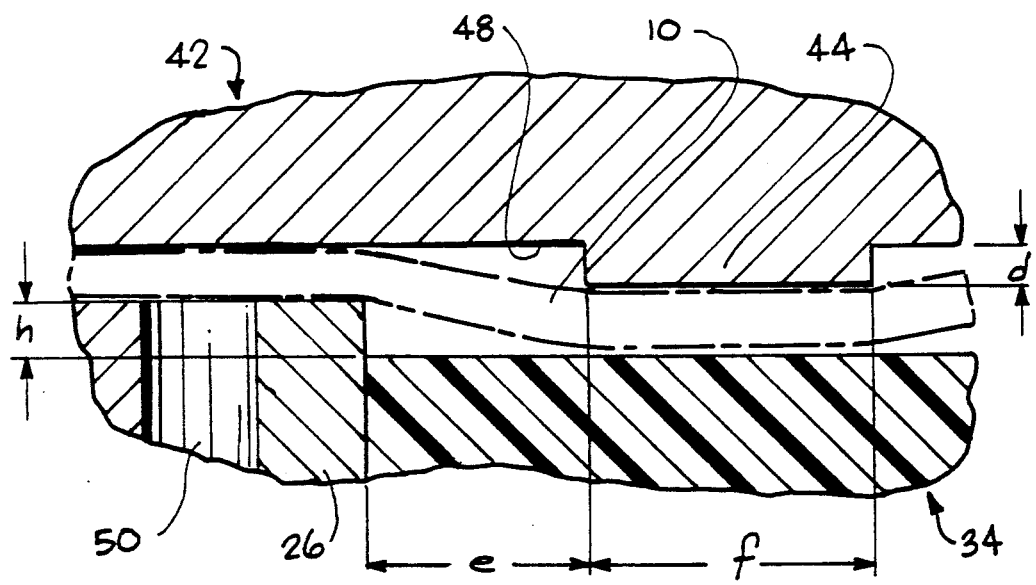
FIG. 4 is a side sectional view of a portion of interconnect system of FIG. 3 in a fully closed position.

With reference to FIG. 4, the load plate 42 is shown in a lowered position to further stress on the tape automated bonding frame 10. In order to maintain stress along the entirety of the tape automated bonding frame, the downward projection of the ribs 44 is less than the height of the vias 26. The downward projection is represented by the dimension "d", while the rib height is represented by dimension "h". For example, where $h=0.002$ inch, $d=0.0015$ inch. The tape automated bonding frame is shown as contacting both the upper surface of the via 26 and the lower surface 48 of the load plate. In this embodiment, a compression force further ensures conformity of the tape automated bonding frame to the via. This compression force, however, is not critical to the present invention. The downwardly extending ribs 44 in conjunction with the upwardly extending vias 26 provide a shearing stress which urges the desired conformity.

The ribs 44 are designed such that thermal expansion of the tape automated bonding frame 10 is less than the elastic range of the elongation of the frame due to displacement under the load plate 42. Use of copper to construct both the frame 10 and the ribs 44 satisfies this requirement. Preferably, the width of a rib is greater than the distance between the rib and an adjacent via 26. For example, dimension "f" may be 0.010 inch, while dimension "e" may be 0.008 inch. As shown in FIG. 4, the tape automated bonding frame 10 does not contact the substrate 34 other than at the vias 26. This maintains proper stressing of the tape automated bonding frame and guards against inadvertent shorting of a signal trace on the frame to a trace on the substrate 34.

Referring now to FIGS. 1-4, in operation the outer lead ends 18-24 of the signal traces 12-16 electrically contact the vias 26-32 to allow electrical communication between an integrated circuit chip, not shown, and the substrate 34. The substrate may be a printed circuit board, of which only a portion is shown. Pins at the bottom side of the printed circuit board may be inserted into the via holes 50, with the pins conducting signals to and from the vias 26-32. Alternatively, the vias may be connected to internal layers of the printed circuit board which may be attached to other tape automated bonding frames as well. For example, the substrate may be a portion of a multi-chip module.

Figure 5A:
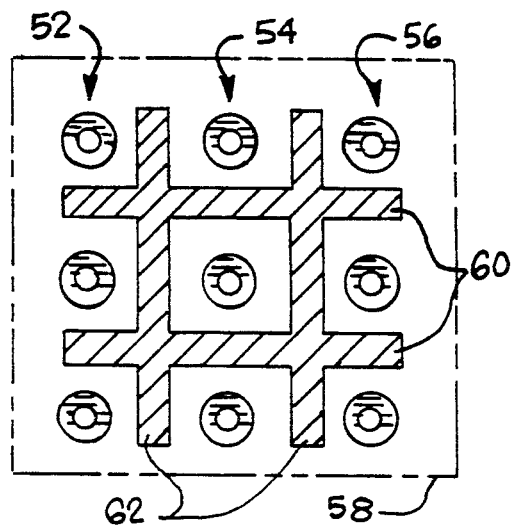
FIGS. 5a–5d are alternative embodiments of the load plate of the present invention.
Figure 5B:
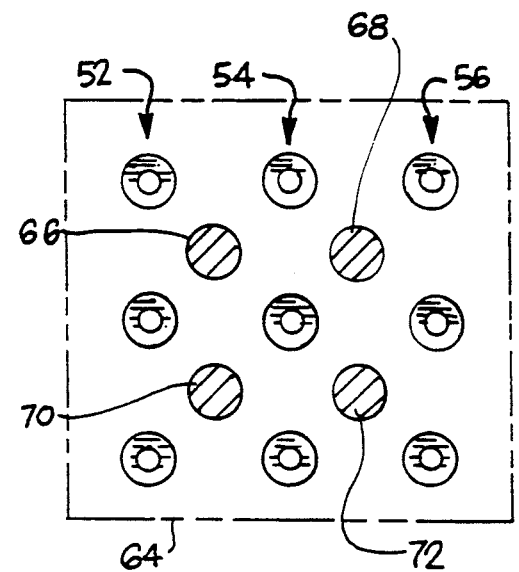

FIGS. 5a-5d illustrate alternate embodiments of the downwardly projecting regions of a load plate. In each figure, there are three columns 52, 54 and 56 of vias for connection to a corresponding pattern of signal trace ends of a tape automated bonding frame, not shown. In FIG. 5a a load plate 58 includes two pairs of intersecting longitudinal ribs 60 and 62 to provide the desired stress between adjacent columns and rows of the vias. In FIG. 5b, a load plate 64 includes four downwardly projecting cylindrical members 66, 68, 70 and 72. The embodiments of FIGS. 5a and 5b are typical of single-metal tape automated bonding frames, i.e. frames with only one metal signal layer and typically no utility plane.

Figure 5C:
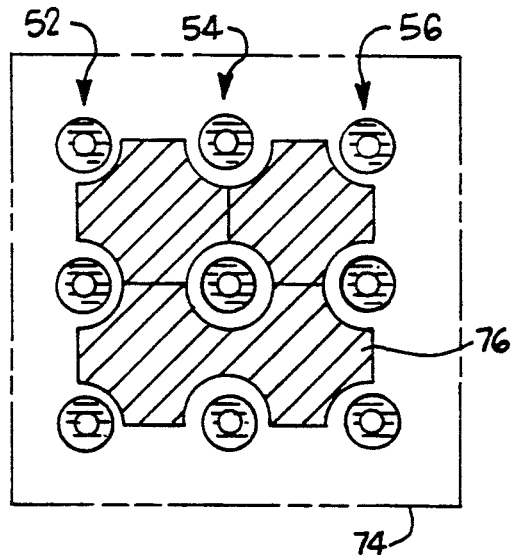
Figure 5D:
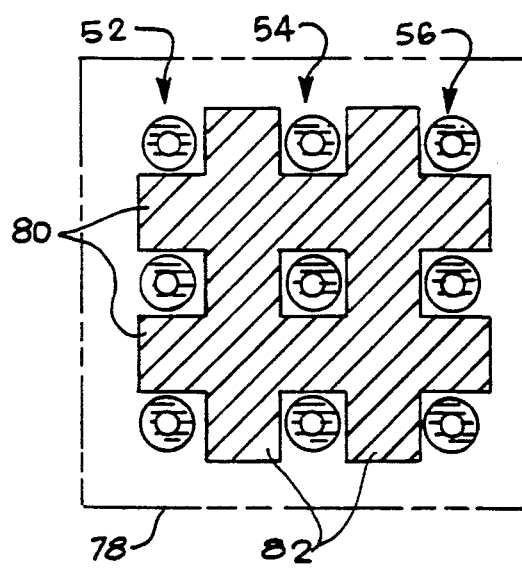

FIGS. 5c and 5d illustrate embodiments to be used in multi-metal layered tape automated bonding frames. In each case, the stress exerted on the tape automated bonding frame is greater than that of the embodiments described above. The load plate 74 of FIG. 5c has a single region 76 which projects downwardly from the load plate, with arcuate cutaways corresponding in curvature to the vias 52-56.

Finally, FIG. 5d illustrates a load plate 78 having intersecting longitudinal ribs having a greater width than the ribs 60 and 62 shown in FIG. 5a, thereby providing the desired stress on the tape automated bonding frame, not shown.

We claim:

1. An apparatus for providing electrical contact between an electronic component and an array of raised contact areas on a rigid substrate comprising,
a tape automated bonding frame having a plurality of conductive fingers in electrical communication with said electronic component, said conductive fingers having a plurality of outer lead ends in mechanical contact with said array of raised contact areas, and
means for exerting a deforming force on said tape automated bonding frame at intermediate regions spaced apart from said outer lead ends and said raised contact areas of substrate, said means being generally rigid and operatively associated with said raised contact areas to provide a shearing stress on said tape automated bonding frame, thereby inducing displacement of said intermediate regions relative to said outer lead ends of said tape automated bonding frame so as to provide proper electrical connection of said outer lead ends to said raised contact areas.

2. The apparatus of claim 1 wherein said compression means is a load plate having a plurality of protrusions extending from a surface thereof, said protrusions being disposed at said intermediate regions spaced apart from outer lead ends.

3. The apparatus of claim 2 wherein said protrusions have a height less than the height of said raised contact areas of said substrate.

4. The apparatus of claim 3 wherein said raised contact areas are one of conductor traces and conductor pads.

5. The apparatus of claim 1 wherein said means is a rigid member having first and second levels, said second levels being below the surface of said raised contact areas when said rigid member is atop said substrate.

6. An apparatus for providing electrical communication between an electronic component and outside circuitry comprising,
a tape automated bonding frame having a plurality of conductive traces, each conductive trace having an inner lead end and an outer lead end, said inner lead ends arranged to align with pads of said electronic component,
a rigid printed circuit board having a generally planar surface having an array of conductive raised contact areas aligned to contact said outer lead ends, and
a load means disposed on a side of said outer lead ends opposite to said printed circuit board for combining with said raised contact areas to tension said tape automated bonding frame, said load means having recessed regions aligned with said outer lead ends and having projecting regions disposed to provide first forces on said tape automated bonding frame at regions spaced apart from said outer lead ends, said raised contact areas exerting second forces on said tape automated bonding frame at said outer lead ends, said first forces each having a major directional component that is opposite to a major directional component of each said second force, thereby deforming said tape automated bonding frame.

7. The apparatus of claim 6 wherein said load means is a plate and wherein said projecting regions are rigid protrusions extending from said plate to deform said tape automated bonding frame.

8. The apparatus of claim 6 wherein said tape automated bonding frame includes a dielectric layer supporting said conductive traces.

9. The apparatus of claim 8 wherein said tape automated bonding frame further includes a conductive layer on a side of said dielectric layer opposite to said conductive traces.

10. The apparatus of claim 6 wherein said raised contact areas of said printed circuit board are conductive pads.

11. The apparatus of claim 6 wherein said projecting regions of said load means form a pattern of intersecting perpendicular protrusions extending from said recessed regions.

12. The apparatus of claim 6 wherein said projecting regions are isolated from each other.

13. The apparatus of claim 6 wherein the height of said projecting regions relative to said recessed regions is less than the height of said contact areas relative to said substrate.

14. A method of connecting an electronic component to other circuitry comprising,
providing a rigid printed circuit board having an array of conductive raised contact areas, aligning a tape automated bonding frame having a corresponding array of outer lead ends with said array of raised contact areas, thereby electrically connecting said outer lead ends to said raised contact areas, and forcing a load plate having projecting regions onto said tape automated bonding frame from a side opposite to said printed circuit board to deform said tape automated bonding frame, said projecting regions being aligned to exert force between adjacent raised contact areas.

15. The method of claim 14 wherein said step of forcing said load plate includes attaching said load member to said substrate.

16. The method of claim 14 wherein said step of aligning said tape automated bonding frame is a step of aligning a frame having a dielectric layer supporting said outer lead ends and having a conductive layer on a surface of said dielectric layer opposite to said outer lead ends.

17. The method of claim 14 wherein said step of forcing said load plate includes displacing portions of said tape automated bonding frame by a distance less than the height of said raised contact areas.

* * * * *